United States Patent
Weston

(10) Patent No.: US 8,546,998 B2
(45) Date of Patent: Oct. 1, 2013

(54) SANDWICH PIEZOELECTRIC DEVICE WITH SOLID COPPER ELECTRODE

(75) Inventor: David Alan Weston, Hendersonville, NC (US)

(73) Assignee: Michelin Recherche et Technique S.A., Granges-Paccot (CH)

( * ) Notice: Subject to any disclaimer, the term of this patent is extended or adjusted under 35 U.S.C. 154(b) by 331 days.

(21) Appl. No.: 12/997,090

(22) PCT Filed: Jun. 26, 2008

(86) PCT No.: PCT/US2008/068290
§ 371 (c)(1),
(2), (4) Date: Dec. 9, 2010

(87) PCT Pub. No.: WO2009/157930
PCT Pub. Date: Dec. 30, 2009

(65) Prior Publication Data
US 2011/0084574 A1    Apr. 14, 2011

(51) Int. Cl.
*H01L 41/113* (2006.01)
*H01L 41/047* (2006.01)

(52) U.S. Cl.
USPC ............ 310/328; 310/339; 310/364; 310/365

(58) Field of Classification Search
USPC .................................. 310/328, 339, 364, 365
See application file for complete search history.

(56) References Cited

U.S. PATENT DOCUMENTS

| | | | |
|---|---|---|---|
| 2,483,677 A | | 10/1949 | Swinehart |
| 3,046,423 A | * | 7/1962 | Wolfskill et al. ............ 310/346 |
| 3,167,668 A | * | 1/1965 | Nesh .............................. 310/340 |
| 4,190,785 A | * | 2/1980 | Kompanek ....................... 341/34 |
| 4,814,661 A | * | 3/1989 | Ratzlaff et al. ............... 310/328 |
| 5,213,739 A | | 5/1993 | Dickerson et al. |
| 5,288,551 A | | 2/1994 | Sato et al. |
| 6,093,997 A | | 7/2000 | Zimnicki et al. |
| 6,198,208 B1 | | 3/2001 | Yano et al. |
| 6,639,150 B1 | * | 10/2003 | Goetz et al. .................... 174/538 |
| 7,468,608 B2 | * | 12/2008 | Feucht et al. .................. 324/633 |
| 2002/0074902 A1 | * | 6/2002 | Kitajima et al. .............. 310/328 |
| 2005/0140252 A1 | * | 6/2005 | Miyata et al. ................. 310/370 |
| 2005/0248237 A1 | | 11/2005 | Wierach |
| 2010/0207493 A1 | * | 8/2010 | Jakli et al. ..................... 310/365 |

FOREIGN PATENT DOCUMENTS

| | | |
|---|---|---|
| EP | 0 926 387 | 6/1999 |
| WO | 2006/054983 | 5/2006 |

OTHER PUBLICATIONS

PCT International Search Report for PCT/US2008/68290, Dated Sep. 18, 2008.
Extended European Search Report for EP 08 77 1997, Dated Jan. 24, 2013.

* cited by examiner

*Primary Examiner* — Thomas Dougherty
(74) *Attorney, Agent, or Firm* — Dority & Manning, P.A.

(57) ABSTRACT

Disclosed are apparatus and methodology for minimizing and compensating for cracking in piezoelectric devices so as to maintain long term functionality of the devices. Compensation for cracking is achieved by applying solid conductive electrodes over the entire surface of the piezoelectric device and extending the electrodes beyond the perimeter of the piezoelectric device. In this way electrical connections are maintained even in the presence of cracking. Cracking of the piezoelectric device is limited by minimizing the local bending moment of the piezoelectric device by way of applying insulative support materials that may vary in thickness.

14 Claims, 3 Drawing Sheets

SANDWICH PIEZOELECTRIC DEVICE WITH SOLID COPPER ELECTRODE

FIELD OF THE INVENTION

The present subject matter relates to signal generators. In particular, the present subject matter relates to piezoelectric generators having solid copper electrodes.

BACKGROUND OF THE INVENTION

The incorporation of electronic devices with tire structures has been shown to yield many practical advantages. Tire electronics may provide their own power source whose operation depends on tire related phenomena and may also include sensors and other components for obtaining information regarding various physical parameters of a tire, such as temperature, pressure, number of tire revolutions, tire rotational speed, etc. Such information may be useful in tire monitoring and warning systems, and may even be employed with feedback systems to monitor proper tire pressure levels.

United States Published Patent Application 2003/0209063 (Adamson et al.) is directed to a system and method for generating electric power from a rotating tire's mechanical energy using piezoelectric fiber composites.

United States Published Patent Application 2003/0056351 (Wilkie et al.) is directed to a piezoelectric micro-fiber composite actuator and a method for making the same.

U.S. Pat. No. 6,093,997 (Zimnicki et al.) is directed to a piezoelectric resonator embedded within an electrically insulating substrate assembly, such as a multilayer printed circuit board.

U.S. Pat. No. 5,747,916 (Sugimoto et al.) is directed to a piezoelectric transformer unit which transforms an input voltage into an output voltage and which includes a piezoelectric transformer element driven by high electric power.

U.S. Pat. No. 5,305,507 (Dvorsky et al.) is directed to a method for encapsulating a ceramic device for embedding in composite structures.

European Patent EP1724849 A2 (Guenther et al.) is directed to an electrically conductive supporting body with a piezoelectric material applied to the body.

While various implementations of piezoelectric generators have been developed, and while various contact configurations have been implemented, no design has emerged that generally encompasses all of the desired characteristics as hereafter presented in accordance with the subject technology.

SUMMARY OF THE INVENTION

In view of the recognized features encountered in the prior art and addressed by the present subject matter, an improved apparatus and methodology has been provided to extend the operational lifetime of piezoelectric devices even in the face of structural damage from normal operation through the provision of solid electrodes.

In an exemplary embodiment, the present subject matter relates to a piezoelectric device comprising a layer of piezoelectric material having a first surface, a second surface, and a perimeter, a first layer of conductive material completely covering the first surface and extending beyond the perimeter of the piezoelectric material, and a second layer of conductive material completely covering the second surface and extending beyond the perimeter of the piezoelectric material. The first and second conductive layers extend beyond the perimeter of the piezoelectric material a sufficient distance so as to avoid the influence of any cracks created in the first or second conductive layers caused by cracks in the piezoelectric material. A first insulating layer supports the piezoelectric material and the first and second layers of conductive material.

In further embodiments solder pads may be coupled to the first and second layers of conductive material, a second insulating layer may be provided that may have the same or a different thickness than the first insulating layer. In preferred embodiments the insulating material may be FR4, the conductive material may be copper, and the piezoelectric material may be lead zirconium titanate (PZT).

In still further embodiments the device may include and elastomeric layer including a mesa portion on which the first insulating layer may be secured by way of an adhesive. In a particular configuration the adhesive may be Chemloc® and the elastomeric material may be rubber.

The present subject matter also relates to methodologies for preserving piezoelectric device functionality in the presence of stress induced cracks. These methodologies comprising providing a layer of piezoelectric material having a first surface, a second surface, and a perimeter and completely covering the first and second surfaces with first and second layers of conductive material. Both the first and second layers of conductive material are extended beyond the perimeter of the piezoelectric material a sufficient distance so as to avoid the influence of any cracks created in the first or second conductive layers caused by cracks in the piezoelectric material.

By employing these methodologies electrically conductive pathways may remain established by way of the conductive material extended beyond the perimeter of the piezoelectric material in the presence of cracks induced in the first and second conductive layers by cracks formed in the piezoelectric material.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures).

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 4b illustrates a cross-section of a portion at line 4-4 of the tire patch illustrated in FIG. 4a.

Figure 1:
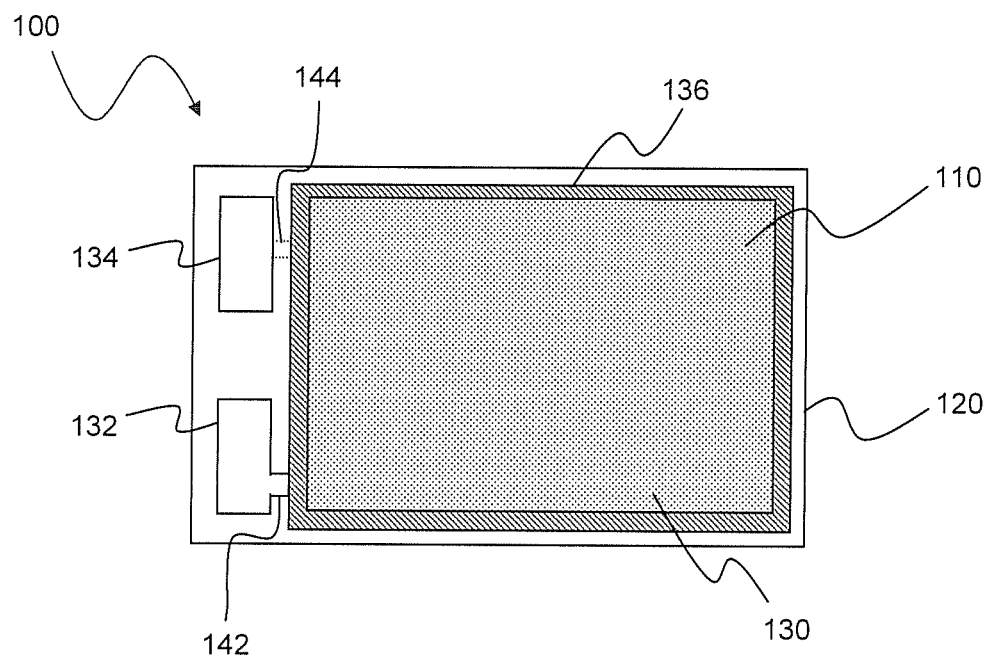
FIG. 1 diagrammatically illustrates an exemplary piezoelectric generator constructed in accordance with present technology.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with an electrode configuration for a piezoelectric generator.

Further, it should be appreciated that the term "generator" is meant to convey that flexure of the piezoelectric device of the present technology will produce an output voltage across output terminals provided on the device. Further still, as the device of the present technology may be employed as a sensor as well as a generator either separately or concurrently, the terms generator and sensor may be used hereinafter interchangeably.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Figure 2:
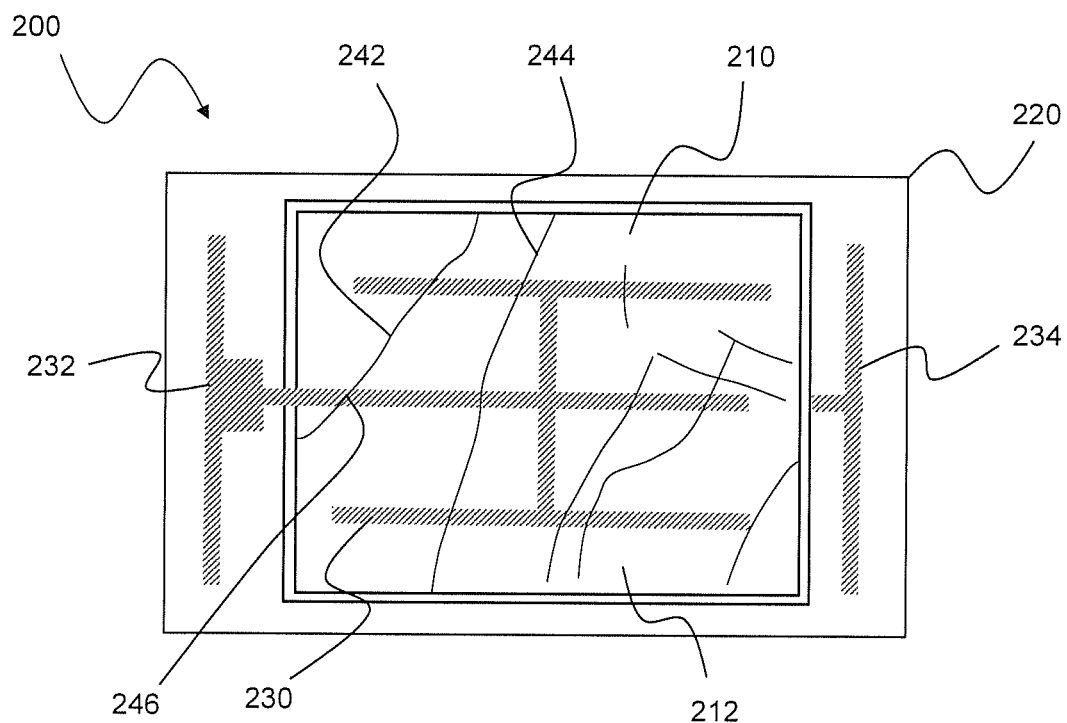
FIG. 2 diagrammatically illustrates a previously known piezoelectric generator construction.

Referring now to the drawings, and, first, briefly, to FIG. 2, there is illustrated a previously known piezoelectric generator 200 for which improvements in accordance with the present technology have been provided. As may be seen from FIG. 2, previously known piezoelectric generator 200 corresponds to a piezoelectric element 210 mounted on a support 220. An etched patterns of conductive electrodes are provided on both the illustrated upper surface 212 of piezoelectric element 210 as electrode pattern 230 as well as an under side that is hidden in the FIG. 2 view. These electrode patterns are connected respectively to terminals 232, 234 for the upper and under sides of the piezoelectric element 210.

Piezoelectric generators of the type illustrated in FIG. 2 have been used in several environments including tires but it has been found that in such environments, cracking, as for example as illustrated by cracks 242, 244 often develop in the piezoelectric element 210 due to stress imparted to the piezoelectric element 210 from, such as, flexing of the tire in which the piezoelectric generator 200 is mounted.

Those of ordinary skill in the art will appreciate that such cracks 242, 244 forming in the piezoelectric element 210 ultimately cause cracks and discontinuities in the conductive electrode patterns, thereby diminishing or even eliminating collection of charge at terminals 232, 234. For example at location 246 where a crack crosses a single connection line from electrode pattern 230 to terminal 232, no charge is able to reach terminal 232 thus rendering piezoelectric generator 200 completely inoperative.

With reference now to FIG. 1, it may be noticed that piezoelectric generator 100, constructed in accordance with present technology, has provided a piezoelectric device 110 mounted on a support 120 that is completely covered by an electrode 130. It should be appreciated that piezoelectric device 110 is actually hidden by electrode 130 in FIG. 1.

Further, electrode 130 actually extends beyond the edges of piezoelectric device 110 as illustrated by conductive extension portion 136 that is formed as an integral part of electrode 130. Conductive extension portion 136 of electrode 130 extends beyond the perimeter of piezoelectric device 110 a sufficient distance so as to avoid the influence of any cracks created in the conductive layer 130 caused by cracks in the piezoelectric device 110 below electrode 130. Electrode 130 and its extension portion 136 are coupled by additional conductive trace 142 to solder pad 132. It will be appreciated that a similar electrode and extension portion are provide on the under side of piezoelectric device 110 and are connected by way of conductive trace 144 to solder pad 134. In an exemplary configuration, conductive electrode 130 including extension portion 136, trace 142, 144 and solder pads 132, 134 may be implemented in copper. Of course, other suitable conductive materials may also be employed.

Providing such a solid conductive electrode does not prevent cracking of the piezoelectric material but rather allows for continued ability to harvest energy from even severely cracked piezoelectric devices at least so long as the perimeter conductive trace 136 remains intact and the pieces of the cracked piezoelectric device 110 remain adhered to the support 120.

Figure 3A:
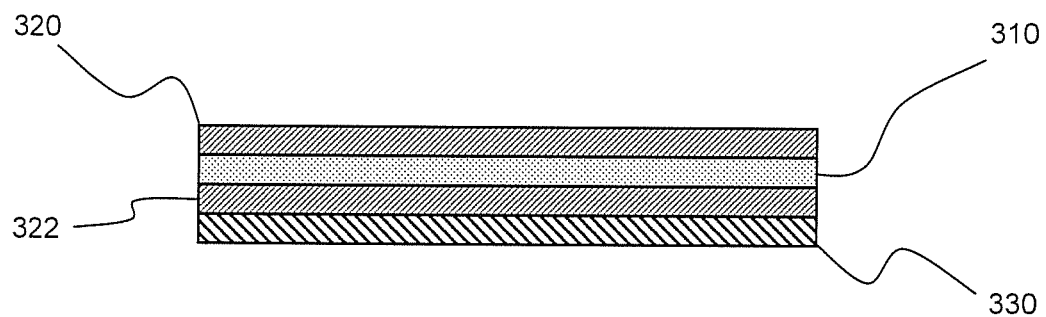
FIGS. 3a-3c diagrammatically illustrate various sandwich type construction methodologies that may be employed in the construction of a generator in accordance with present technology.
Figure 3B:
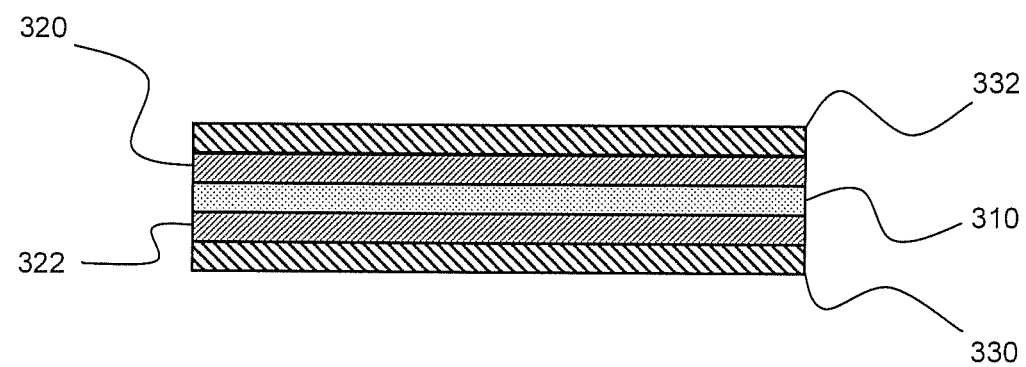
Figure 3C:
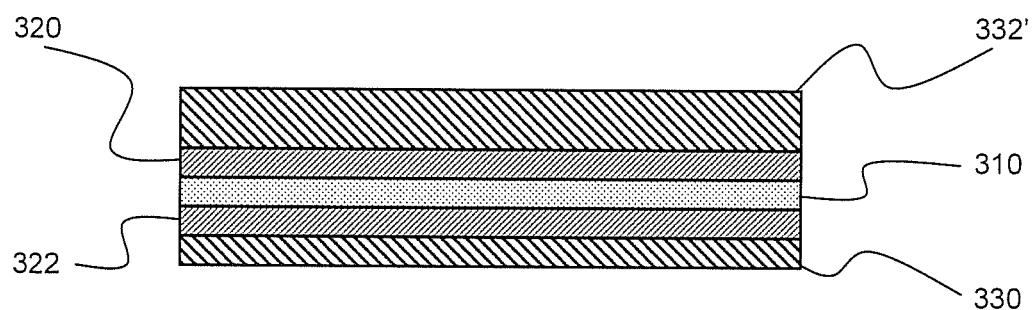

With reference now to FIGS. 3a-3c attention will be directed to various constructional aspects of a piezoelectric device constructed in accordance with present technology. As previously mentioned, the present subject matter relates to a sandwich type construction. As illustrated in FIG. 3a, an exemplary embodiment of such construction is shown to correspond to a piezoelectric layer 310 sandwiched between conductive layers 320, 322 all supported by an insulating support layer 330. In an exemplary configuration piezoelectric layer 310 may correspond to a lead zirconium titanate (PZT) layer, conductive layers 320, 322 may correspond to copper layers and insulating support layer 330 may correspond to a fire retardant insulating material commonly called FR4.

In a further exemplary embodiment as illustrated in FIG. 3b, another insulating support layer 332, which may also correspond to FR4, may be added to complete the sandwich structure. A particular advantage of the inclusion of dual insulating support layers resides in the capability to minimize the peak local bending moment of the piezoelectric layer 310 and thereby minimize cracking by optimizing the thickness of the support layer or layers.

It should be evident to those of ordinary skill in the art that such optimization requires judicious selection of the thickness of the insulating layer or layers. For example, at an extremely large thickness, all bending of the piezoelectric layer will be prevented thereby eliminating generation of signal producing voltages. Obviously, as the thickness becomes less and less, additional bending becomes possible thus eventually eliminating the benefits obtained from reductions in the local bending moment. An additional benefit of providing a double layer of insulating support material results from the encapsulation of the piezoelectric layer by such double insulating layers thereby providing additional physical protection for the piezoelectric layer.

FIG. 3c illustrates yet another embodiment of the sandwich structure. In this instance, insulating layer 332' is made thicker than insulating layer 332. Such a change in thickness from one insulating layer to another offsets the piezoelectric layer from the central neutral plane of the sandwich structure and provides an opportunity to further adjust energy generation. Insulating layer 332' may be provided by way of a thicker layer of insulating material or by providing two or more separate layers of material. It should be appreciated that the two or more layers may themselves be of different thickness as well as of the same thickness or combinations thereof.

Figure 4A:
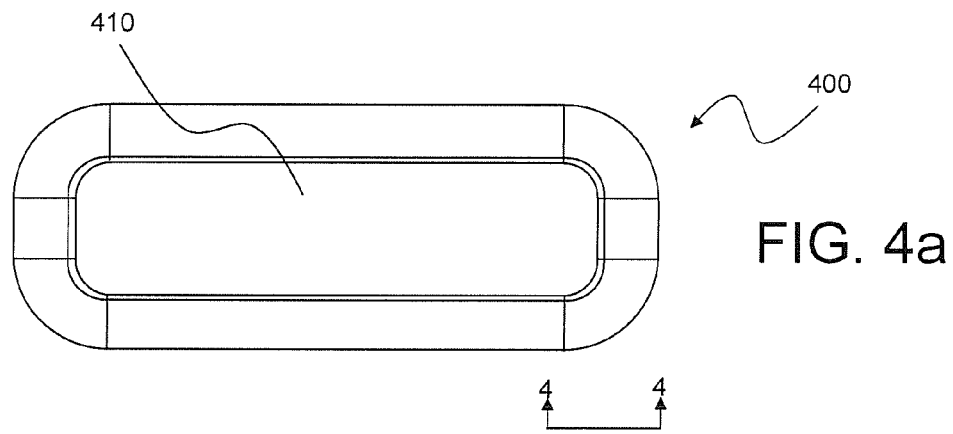
FIG. 4a illustrates a tire patch including a generator constructed in accordance with present technology mounted thereon.
Figure 4B:
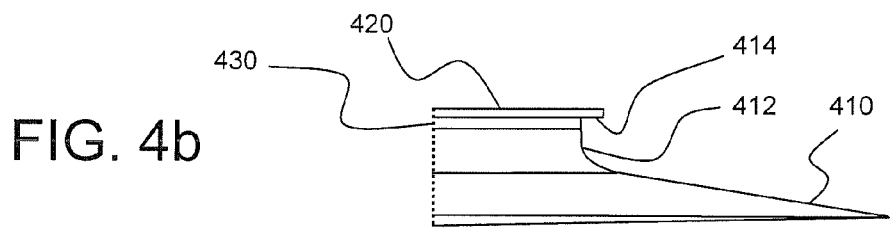

With reference now to FIGS. 4a and 4b, there is illustrated and exemplary tire patch 400 incorporating a sandwich structured piezoelectric device constructed in accordance with the present technology. FIG. 4b illustrates an enlarged cross-section of a portion of tire patch 400 taken at lines 4-4 of FIG. 4a. As illustrated in FIG. 4a, a tire patch 400 corresponding to an elastomeric support 410 and an integrally formed central mesa 412 may be used to support the sandwich structure piezoelectric device 420. Piezoelectric device 420 may be secured to the upper surface of mesa 412 by way of an adhesive layer. In an exemplary embodiment, elastomeric support 410 and integral mesa 412 correspond to rubber and adhesive 430 may correspond to Chemloc® adhesive available from LORD Corporation. In an exemplary construction, Chemloc® may be applied to a surface of the sandwich structure, the structure placed in a mold with rubber material and then cured.

As illustrated in FIGS. 4a and 4b, sandwich structure piezoelectric device 420 may correspond to a device covering substantially the entire upper surface of mesa 412 and may, in fact, actually overhang the upper surface of mesa 412 slightly as illustrated by overhang 414 in FIG. 4b.

Figure 5:
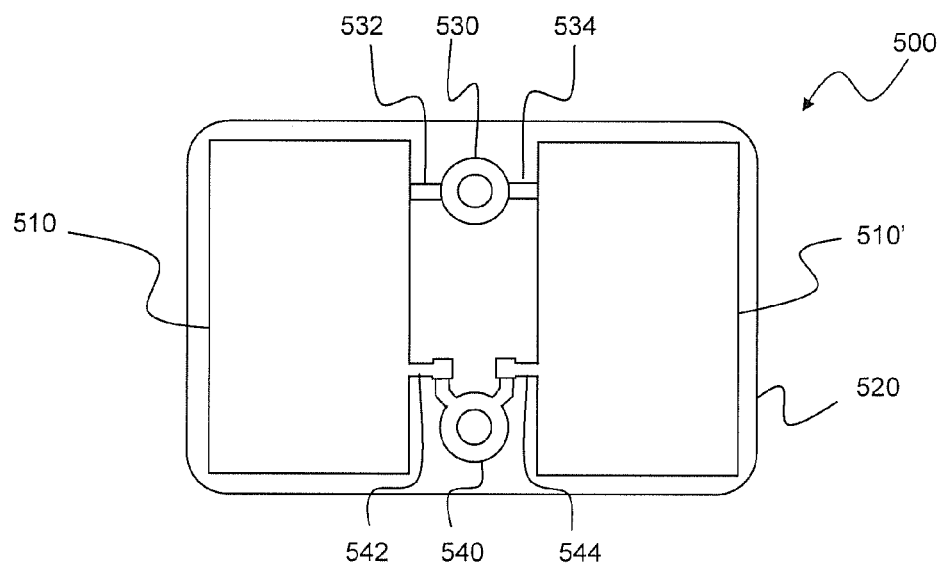
FIG. 5 illustrates a dual piezoelectric sensor configuration constructed in accordance with the present technology.

With reference now to FIG. 5, there is illustrated another embodiment of a sandwich structure piezoelectric device 500 constructed in accordance with present technology. As may be seen, sandwich structure piezoelectric device 500 corresponds to a pair of sandwich structure piezoelectric devices 510, 510' mounted on a common insulating support layer 520. As with previous embodiments, insulating layer 520 may correspond to a layer of FR4. Furthermore, an additional insulating layer, also possibly FR4, may be provided as described with respect to FIG. 3b. Still further, such additional layer of insulating material may be varied in thickness or provided as plural layers to achieve thickness variations as discussed with reference to FIG. 3c.

With further reference to FIG. 5, it will be noticed that sandwich structure piezoelectric devices 510, 510' are electrically coupled in parallel by way of conductive traces 532, 534 through connection terminal 530 and 542, 544 through connection terminal 540. It should be appreciated based on previous descriptions herein above that sandwich structure piezoelectric devices 510, 510' each correspond to sandwich structures that include a first conductive layer that, in the instance of the sandwich structure piezoelectric devices 510, 510' illustrated correspond to the layers illustrated as connected together by way of traces 542, 544 while the second conductive layers correspond to those connected together by way of traces 532, 534.

It should further be appreciated that while the illustrated pair of sandwich structure piezoelectric devices 510, 510' are shown connected in parallel, other connection schemes are possible including serial connection as well as individual connection by way of additional, separate terminal pairs. Further still, it should be appreciated that the illustrated pair of commonly mounted device 510, 510' may be jointly mounted to create a tire patch as illustrated in FIG. 4a. Furthermore, those of ordinary skill in the art will appreciate, given the present disclosure, that multiple pairs of commonly mounted devices may be provided and electrically coupled in any desired fashion from parallel to serial to individual and combinations thereof all within the scope of the present subject matter. In a yet further configuration, a plurality of piezoelectric devices may be commonly mounted and connected in parallel by use of single layers of conductive material covering both sides of the plurality of devices.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A piezoelectric device, comprising:
   a layer of piezoelectric material having a first surface, a second surface, and a perimeter;
   a first layer of conductive material completely covering said first surface and extending beyond the perimeter of said piezoelectric material;
   a second layer of conductive material completely covering said second surface and extending beyond the perimeter of said piezoelectric material; and
   a first insulating layer supporting said piezoelectric material and said first and second layers of conductive material;
   a second insulating layer;
   wherein said piezoelectric layer is sandwiched between said first and second conductive layers and said first insulating layer and said second insulating layer form outer sandwich layers for the piezoelectric layer and the first and second conductive layers, wherein the first insulating layer and the second insulating layer have different thicknesses.

2. The device of claim 1, further comprising:
   a first solder pad electrically coupled to said first layer of conductive material; and
   a second solder pad electrically coupled to said second layer of conductive material.

3. The device of claim 1, wherein the first and second insulating layers are FR4.

4. The device of claim 1, wherein the first and second conductive layers are copper.

5. The device of claim 1, wherein said piezoelectric material comprises lead zirconium titanate (PZT).

6. The device of claim 1, further comprising:
   an elastomeric layer having a base portion and a mesa portion,
   wherein said first insulating layer is secured to said elastomeric layer with an adhesive.

7. The device of claim 6, wherein said elastomeric layer is a rubber layer.

8. The device of claim 6, wherein said adhesive is Chemloc®.

9. A method for preserving piezoelectric device functionality in the presence of stress induced cracks, comprising:
- providing a layer of piezoelectric material having a first surface, a second surface, and a perimeter;
- completely covering said first surface with a first layer of conductive material;
- extending the first layer of conductive material beyond the perimeter of said piezoelectric material;
- completely covering said second surface with a second layer of conductive material;
- extending the second layer of conductive material beyond the perimeter of said piezoelectric material;
- adhering at least one insulating support layer to at least one of said first and second layers of conductive material; and
- adhering the at least one insulating support layer to an elastomeric material suitable for mounting to a tire, the elastomeric material having a base portion and a mesa portion, said at least one insulating support layer being secured to the elastomeric layer with an adhesive.

10. The method of claim 9, wherein providing a layer of piezoelectric material comprises providing a layer of lead zirconium titanate (PZT).

11. The method of claim 9, wherein the conductive material is copper.

12. The method of claim 9, wherein the elastomeric material comprises rubber.

13. A tire patch, comprising:
- a layer of piezoelectric material having a first surface, a second surface, and a perimeter;
- a first layer of conductive material completely covering said first surface and extending beyond the perimeter of said piezoelectric material;
- a second layer of conductive material completely covering said second surface and extending beyond the perimeter of said piezoelectric material; and
- a first insulating layer supporting said piezoelectric material and said first and second layers of conductive material;
- a second insulating layer disposed opposite the first insulating layer such that the layer of piezoelectric material is sandwiched between the first layer of conductive material and the second layer of conductive material and such that the first insulating layer and the second insulating layer form outer sandwich layers for the piezoelectric layer and the first and second conductive layers; and
- an elastomeric layer secured to the first insulating layer.

14. The tire patch of claim 13, wherein the first insulating layer and the second insulating layer have different thicknesses.

* * * * *